United States Patent
Hu

(10) Patent No.: US 6,365,507 B1
(45) Date of Patent: Apr. 2, 2002

(54) METHOD OF FORMING INTEGRATED CIRCUITRY

(75) Inventor: Yongjun Jeff Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/260,237

(22) Filed: Mar. 1, 1999

(51) Int. Cl.[7] .......................................... H01L 21/4763
(52) U.S. Cl. ........................ 438/627; 438/648; 438/685
(58) Field of Search ................................ 438/627, 629, 438/630, 698, 649, 674, 675, 685

(56) References Cited

U.S. PATENT DOCUMENTS

| | | | |
|---|---|---|---|
| 4,746,219 A | 5/1988 | Holloway et al. | 2557/396 |
| 4,863,559 A | 9/1989 | Douglas | 156/643 |
| 4,994,402 A | 2/1991 | Chiu | 437/41 |
| 5,032,233 A | 7/1991 | Yu et al. | 204/192.48 |
| 5,043,300 A | 8/1991 | Nulman | 437/200 |

(List continued on next page.)

FOREIGN PATENT DOCUMENTS

| | | | | |
|---|---|---|---|---|
| EP | 0 631 309 A2 | 12/1994 | | H01L/21/90 |
| EP | 0 631 309 A3 | 12/1994 | | H01L/21/90 |
| JP | 06-010673 A | 1/1994 | | F02B/23/06 |

OTHER PUBLICATIONS

Byun, Jeong Soo et al., "Formation Of A Large Grain Sized TiN Layer Using $TiN_x$, The Epitaxial Continuity At The Al/TiN Interface . . .", *J. Appl. Phys.*, 78(3), pp. 1719–1724 (Aug. 1995).

Byun, Jeong Soo, "Epitaxial $C49-TiSi_2$ Formation On (100)Si Substrate Using $TiN_x$, And Its Electrical Characteristics As A Shallow Contact Metallization", *J. Electrochem. Soc.*, vol. 143, No. 6, pp. 1984–1991 (Jun. 1996).

(List continued on next page.)

*Primary Examiner*—Carl Whitehead, Jr.
*Assistant Examiner*—Jeff Vockrodt
(74) *Attorney, Agent, or Firm*—Wells, St. John, Roberts, Gregory & Matkin

(57) ABSTRACT

In one implementation, a method of depositing a nitrogen enriched metal layer over a semiconductor substrate includes providing a sputter deposition reactor chamber having an inductive coil positioned therein, a metallic target position therein, and a semiconductor substrate positioned therein. A nitrogen containing source gas and a sputtering gas are fed to the reactor chamber. The reactor is operated to provide a selected target power, inductive coil power and substrate bias during the feeding effective to deposit an $MN_x$ comprising layer on the substrate, where "M" is an elemental metal and "x" is greater than 0 and less than 1. One implementation also includes forming a silicide contact to silicon from such layer, preferably with a silicon layer being formed over the $MN_x$ comprising layer. In one implementation, a method of forming a metal source layer in an integrated circuit, where the metal source layer includes a metal and a non-metal impurity, includes selecting a sputtering ambient for a sputter deposition reactor having an inductive coil positioned therein to achieve within about 15% of a maximal resistivity for unsaturated metal layers having the same metal and non-metal impurity. A metallic target is then sputtered in the selected ambient within the reactor. In other aspects, the invention encompasses methods of analyzing impact of operating parameter changes for plasma deposition reactors having an inductive coil positioned therein, and methods of forming integrated circuitry.

51 Claims, 6 Drawing Sheets

U.S. PATENT DOCUMENTS

| | | | |
|---|---|---|---|
| 5,084,406 A | 1/1992 | Rhodes et al. | 437/52 |
| 5,094,977 A | 3/1992 | Yu et al. | 437/174 |
| 5,147,819 A | 9/1992 | Yu et al. | 437/173 |
| 5,187,122 A | 2/1993 | Bonis | 437/200 |
| 5,196,360 A | 3/1993 | Doan et al. | 437/41 |
| 5,236,865 A | 8/1993 | Sandhu et al. | 437/174 |
| 5,278,098 A | 1/1994 | Wei et al. | 437/192 |
| 5,296,404 A | 3/1994 | Akabori et al. | 437/173 |
| 5,326,404 A | 7/1994 | Sato | 118/723 |
| 5,341,016 A | 8/1994 | Prall et al. | 257/412 |
| 5,378,641 A | 1/1995 | Cheffings | 437/35 |
| 5,391,520 A | 2/1995 | Chen et al. | 438/620 |
| 5,480,814 A | 1/1996 | Wuu et al. | 437/41 |
| 5,481,129 A | 1/1996 | DeJong et al. | 257/360 |
| 5,589,417 A | 12/1996 | Jeng | 438/643 |
| 5,593,511 A | 1/1997 | Foster et al. | 148/238 |
| 5,627,102 A | 5/1997 | Shinriki et al. | 438/648 |
| 5,654,235 A | 8/1997 | Matsumoto et al. | 438/643 |
| 5,683,930 A | 11/1997 | Batra et al. | 438/238 |
| 5,756,394 A | 5/1998 | Manning | 438/618 |
| 5,766,997 A | 6/1998 | Takeuchi | 438/257 |
| 5,776,831 A | 7/1998 | Padmanabhan et al. | 438/653 |
| 5,783,478 A | 7/1998 | Chau et al. | 438/592 |
| 5,925,225 A | 7/1999 | Ngan et al. | 204/192.17 |
| 5,985,759 A * | 11/1999 | Kim et al. | 438/653 |
| 6,074,921 A | 6/2000 | Lin | 438/299 |
| 6,080,665 A * | 6/2000 | Chen et al. | 438/653 |
| 6,117,761 A | 9/2000 | Manning | 438/618 |
| 6,156,647 A * | 12/2000 | Hogan | 438/653 |

OTHER PUBLICATIONS

Byun, Jeong Soo et al., "Epitaxial TiSi$_2$ Growth On Si(100) From Reactive Sputtered TiN$_2$ And Subsequent Annealing", *Materials Research Soc. Proceedings*, Pittsburgh, vol. 355, pp. 465–470 (1995).

Byun, Jeong Soo, et al., "W As A Bit Line Interconnection In Capacitor–Over–Bit–Line (COB) Structured Dynamic Random Access Memory (DRAM) and Feasible Diffusion Barrier Layer", *J. Appl. Phys.*, vol. 35, pp. 1086–1089 (1996).

Byun, Jeong Soo, et al., "TiN/TiSi$_2$ Formation Using TiN$_x$ Layer And Its Feasibilies In ULSI", *Jpn. J. Appl. Phys.*, vol. 35, pp. 982–986 (1995).

Murakami, Shigeru, et al., "Plasma–Nitridated Ti Contact System For VLSI Interconnections", *I.E.E.E., Multilevel VLSI Interconnection Conference*, IEEE Catalog No. 87CH2488–5, pp. 148–154, (Jun. 1987).

Stanley Wolf, Ph.D., *Silicon Processing for the VLSI Era*, vol. II, pp. 567–583 (1990 Lattice Press).

* cited by examiner

METHOD OF FORMING INTEGRATED CIRCUITRY

TECHNICAL FIELD

This invention relates to methods of depositing nitrogen enriched metal layers, to methods of forming silicide contacts to silicon comprising substrates, to methods of forming metal source layers in integrated circuits, to methods of analyzing impact of operating parameter changes for plasma deposition reactors having an inductive coil positioned therein, and to methods of forming integrated circuitry.

BACKGROUND OF THE INVENTION

In the processing of integrated circuits, electrical contact is typically made to isolated active device regions formed within a wafer substrate typically comprising monocrystalline silicon. The active regions are typically connected by electrically conductive paths or lines which are fabricated above an insulative material formed over the substrate surface. Further, electrical contact is also typically made to other conductive regions received outwardly of the wafer, such as to conductive lines, contact plugs and other devices. To provide electrical connection between two conductive regions, an opening in an insulative layer is typically etched to the desired regions to enable subsequently formed conductive films to make electrical connection with such regions.

The drive for integrated circuits of greater complexity, performance and reduced size has driven designers to shrink the size of devices in the horizontal plane. Yet to avoid excessive current density, the horizontal scaling has not necessarily been accompanied by a reduction in the vertical dimension. This has resulted in an increase of the ratio of device height to device width, something generally referred to as aspect ratio, and particularly with respect to contact openings. Such currently ranges from 1.0 to 5, and is expected to increase. The circuit density increase places increasing constraints on the conductivity of the contacts themselves.

As transistor active area and other device dimensions approached 1 micron, conventional process parameters resulted in intolerable increased resistance between the active region or device area and the conductive layer. A principal way of reducing such contact resistance is by formation of a metal silicide atop the active area prior to application of the conductive film for formation of the conductive runner. Common metal silicides are refractory metal silicides, such as $TiSi_x$, where "x" is predominately 2. The $TiSi_x$ material is typically provided by first applying a thin layer of titanium atop the wafer which contacts the silicon containing active areas within the contact openings. Thereafter, the wafer is subjected to a high temperature anneal. This causes the titanium to react with the silicon of the active area, thus forming the $TiSi_x$. Such a process is said to be self-aligning, as the $TiSi_x$ is only formed where the titanium metal contacts silicon. The applied titanium film typically everywhere else overlies an insulative, and substantially non-reactive, $SiO_2$ layer. After the first annealing, unreacted titanium may be removed selectively relative to the formed silicide by a wet etch. Further, a post-silicidation anneal might be conducted to lower sheet resistance of the formed silicide.

In the silicidation process, silicon from contact regions of the substrate diffuses upward into the refractory metal layer. Similarly, the refractory metal diffuses into the underlying silicon. The intent is for the titanium and silicon to react with each other to form a silicide thick enough to provide low sheet resistance and make a highly conductive contact interface. As a result, the doped active area of the silicon substrate (or other silicon construction) becomes thinner due to the consumption of silicon during the reaction. The resultant silicide is said to intrude or sink into the substrate or device. Over-consumption of the underlying silicon can be problematic for any silicon circuit element, tending to cause voids and thus device failures. Tendency in the industry is to make shallower and shallower active area junctions in the silicon substrates. In some instances, silicide contacts of sufficient thickness cannot be formed without completely destroying a junction because of silicon consumption from the underlying substrate.

The invention was principally motivated in addressing these problems, but is not so limited and has other applicabilities as will be appreciated by the artisan.

SUMMARY

In certain aspects, the invention encompasses one or more of a) methods of depositing nitrogen enriched metal layers, b) methods of forming silicide contacts to silicon comprising substrates, c) methods of forming metal source layers in integrated circuits, d) methods of analyzing impact of operating parameter changes for plasma deposition reactors having an inductive coil positioned therein, and e) methods of forming integrated circuitry.

In one implementation, a method of depositing a nitrogen enriched metal layer over a semiconductor substrate includes providing a sputter deposition reactor chamber having an inductive coil positioned therein, a metallic target position therein, and a semiconductor substrate positioned therein. A nitrogen containing source gas and a sputtering gas are fed to the reactor chamber. The reactor is operated to provide a selected target power, inductive coil power and substrate bias during the feeding effective to deposit an $MN_x$ comprising layer on the substrate, where "M" is an elemental metal and "x" is greater than 0 and less than 1. One implementation also includes forming a silicide contact to silicon from such layer, preferably with a silicon layer being formed over the $MN_x$ comprising layer.

In one implementation, a method of forming a metal source layer in an integrated circuit, where the metal source layer includes a metal and a non-metal impurity, includes selecting a sputtering ambient for a sputter deposition reactor having an inductive coil positioned therein to achieve within about 15% of a maximal resistivity for unsaturated metal layers having the same metal and non-metal impurity. A metallic target is then sputtered in the selected ambient within the reactor.

Preferred implementations of the above and other aspects of the invention are described below.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A method of depositing a nitrogen enriched metal layer over a semiconductor substrate is initially described with reference to FIGS. 1–5. A method of forming a silicide contact or silicide interconnect to a silicon comprising substrate is also initially described with reference to FIGS. 1–5. This preferred method as depicted and described constitutes a self-aligned silicide contact formation process, although the invention is of course not so limited.

Figure 1:
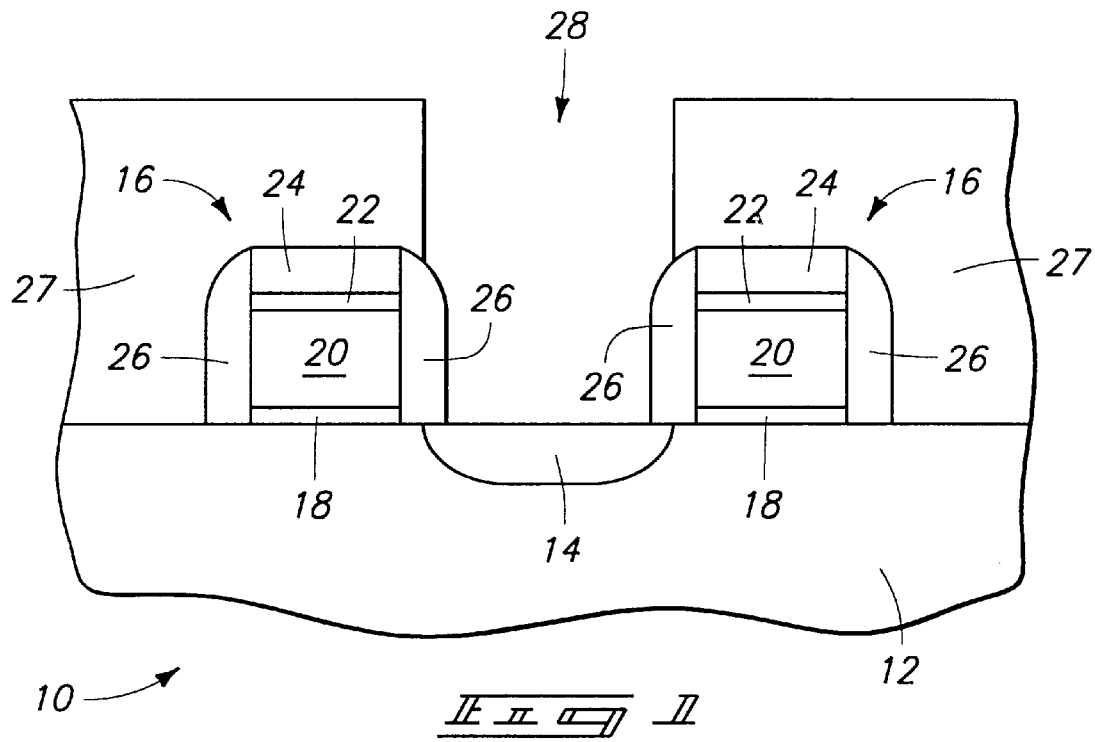
FIG. 1 is a diagrammatic sectional view of an exemplary semiconductor wafer fragment at one processing step in accordance with an aspect of the invention.

FIG. 1 depicts a semiconductor wafer fragment 10 comprising a bulk monocrystalline semiconductor substrate 12. In the context of this document, "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 12 includes a highly doped diffusion region 14 formed therein, and two adjacent transistor gate structures 16 formed over substrate 12. In the preferred embodiment, diffusion region 14 comprises a transistor source or drain having an ultra-shallow junction depth of no more than about 1,000 Angstroms from the depicted outer surface of substrate 12. Gate structures 16 include gate dielectric layers 18, polysilicon regions 20, metallic silicide layers 22, protective insulative caps 24, and insulative sidewall spacers 26. Insulating materials 24 and 26 typically constitute the same material, with undoped $SiO_2$ and $Si_3N_4$ being examples. An insulative material layer 27, such as borophosphosilicate glass (BPSG), has been formed and planarized outwardly of substrate 12 and gate structures 16. A contact opening 28 is formed through insulative material 27 to provide exposure to silicon of silicon comprising substrate 12.

Figure 2:
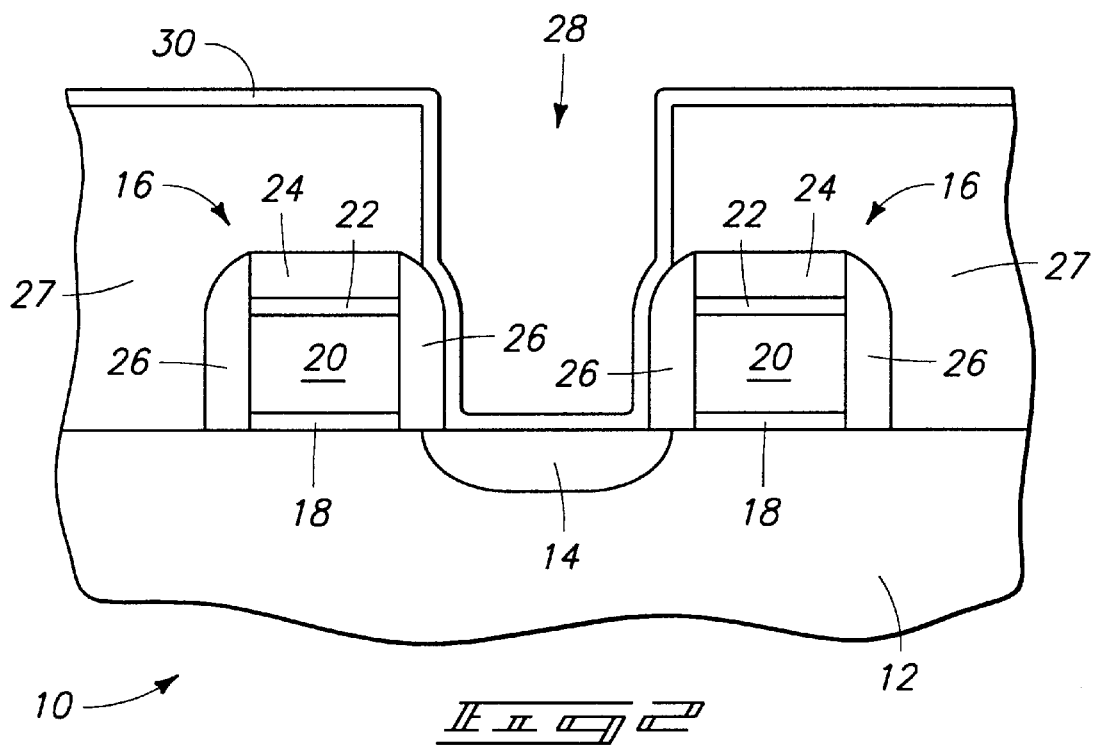
FIG. 2 is a view of the FIG. 1 wafer fragment at a processing step subsequent to that shown by FIG. 1.
Figure 9:
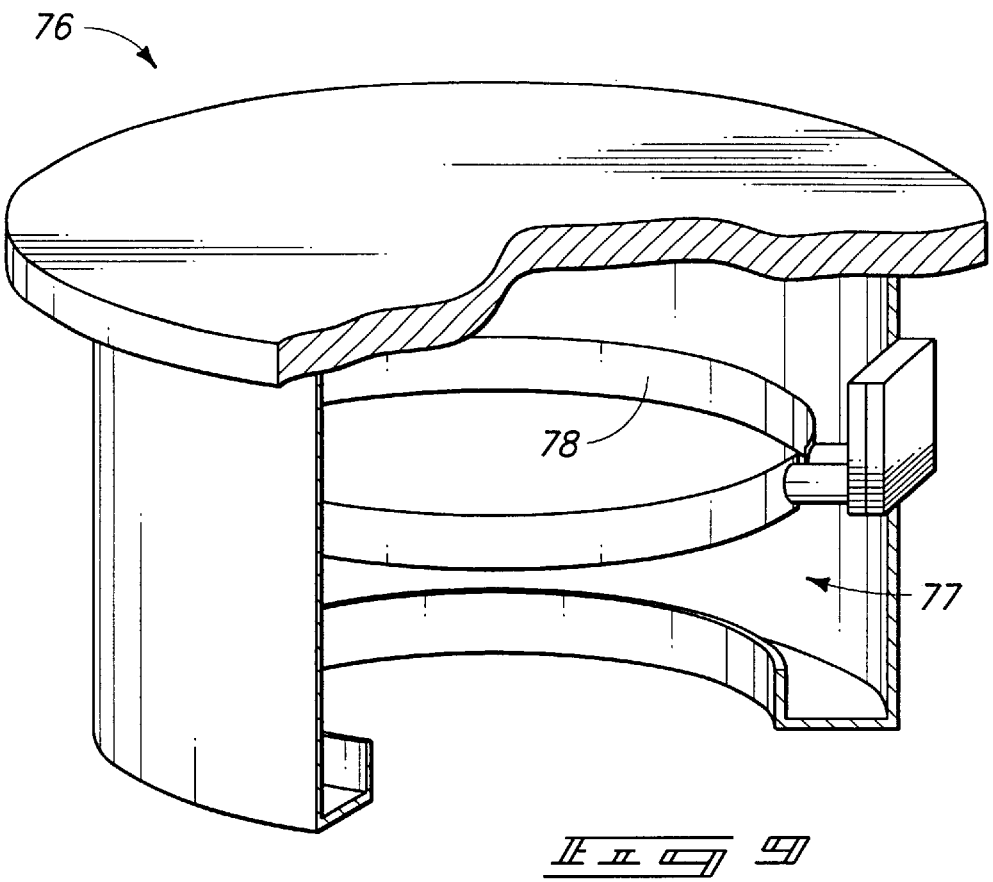
FIG. 9 is a perspective view of a processing reactor, with a portion broken away for clarity, in accordance with one preferred embodiment of the present invention.
Figure 10:
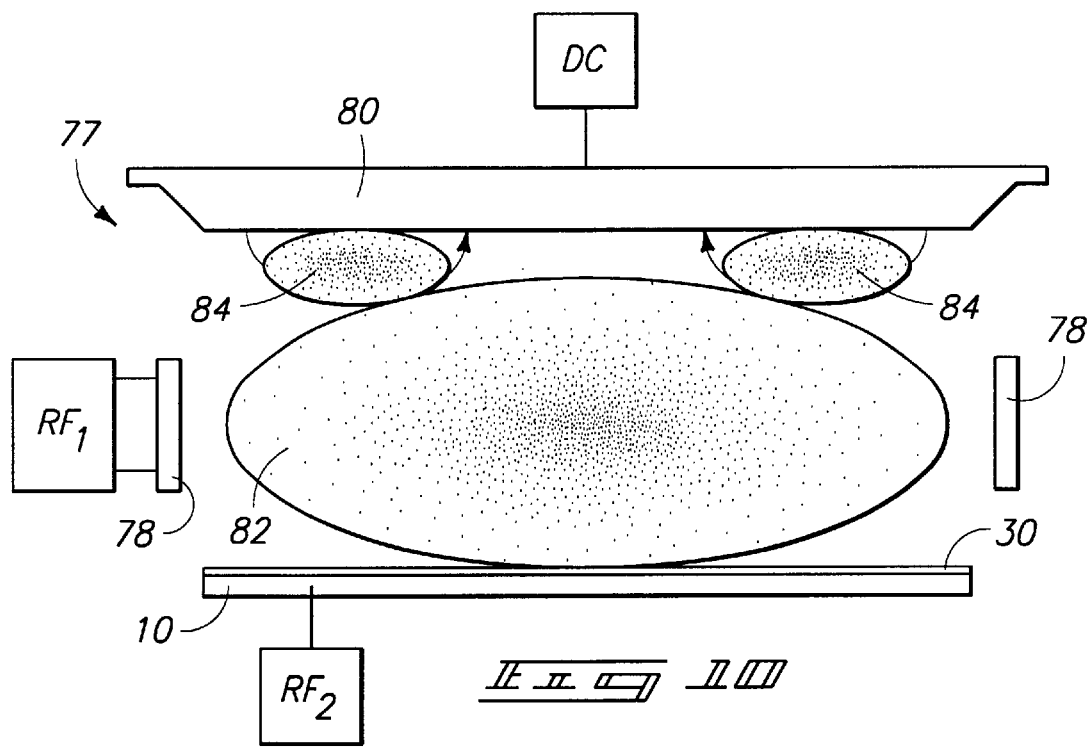
FIG. 10 is an elevational schematic view of one aspect of processing in accordance with a preferred embodiment of the invention.

Referring to FIG. 2, a conductive or metal layer 30 has been deposited over fragment 10 and specifically to within contact opening 28. Layer 30 preferably comprises a refractory metal, for example Ti. The method by which such conductive layer 30 is formed is utilizing a sputter deposition reactor, for example as exemplified and described with reference to FIGS. 9 and 10. FIG. 9 depicts a broken perspective view of an exemplary processing reactor emphasizing preferred inductive coil positioning, with other reactor components not being depicted for clarity. FIG. 10 diagrammatically depicts operation of the exemplary reactor of FIG. 9 showing target, wafer, inductive coil, and plasma generation as will now be more specifically described. A sputtering reactor 76 in FIG. 9 includes an inductive coil 78 mounted within a reactor chamber 77. The preferred and reduction-to-practice sputter deposition system is a Magnatron System available from Applied Materials as an Ion Metal Plasma (IMP) Reactor™. Such is capable of retaining and DC biasing a target 80 and an $RF_2$ biased substrate (FIG. 10), such as for example substrate 10 as depicted in FIG. 1.

In this described and preferred example, a goal is to deposit layer 30 to comprise a metal and a non-metal impurity. The non-metal impurity in the preferred embodiment comprises nitrogen, and results in a layer comprising $MN_x$ where "M" is an elemental metal, preferably a refractory metal, and "x" is greater than 0 and less than 1. A preferred goal is accordingly to achieve layer 30 deposition as constituting primarily an impurity-laden metal layer "M" (or alloy layer) as opposed to some stoichiometric metal nitride compound layer. A more particular and preferred example for "M" is titanium, with target 80 preferably consisting essentially of elemental titanium. The quantity "x" preferably ranges from 0.2 to 0.8, with from 0.5 to 0.6 being more preferred.

In preferred aspects of the invention, a nitrogen containing source gas and a sputtering gas are fed to reactor chamber 77. The reactor is operated during such feeding to provide a selected target power, inductive coil power, and substrate bias to deposit an $MN_x$ comprising layer 30 onto substrate 10. Using the reduction-to-practice IMP reactor, exemplary operable ranges include a substrate bias ($RF_2$) from 0 W (neutral) to 1,000 W, an inductive coil power ($RF_1$) from 1.0 to 5.0 kW, and a target power (DC) of from 1.0 to 5.0 kW. The preferred nitrogen containing source gas is $N_2$, with the preferred sputtering gas being a noble gas, such as Ar.

In accordance with preferred aspects of the invention, metal source layers comprising a metal and a non-metal impurity, particularly where the impurity is present in an unsaturated below-stoichiometric quantity (for example $MN_x$ layer as described above), can be utilized in silicide formation whereby a lower quantity of silicon from an underlying substrate is inherently consumed, and when utilizing layers consisting essentially of elementary refractory metals or alloys. Such is in part the subject of our U.S. patent application Ser. No. 09/026,104, filed on Feb. 19, 1998, and entitled "Asymmetric, Double-Sided Self-Aligned Silicide And Method Of Forming The Same" having the same inventive entity as this patent.

Preferred reactor temperature and pressure ranges for the processing as depicted in FIG. 10 are from room temperature to 250° C. for backside temperature, and preferably from about 10 mTorr to about 30 mTorr. Preferred $RF_2$ bias is from 300 to 500 Watts. Still referring to FIG. 10, a largely magnatron plasma 84 forms near target 80 for sputtering material therefrom, with inductive coil 78 resulting in formation of a gas plasma 82 therebeneath. A high electric field or self-bias develops in the boundary layer or sheath between the plasma and the substrate which accelerates the metal ions toward the substrate in a vector generally perpendicular to the wafer surface, particularly for increasing $RF_2$ bias values. In the preferred example, gas plasma 82/84 as generated within reactor chamber 77 extends entirely between at least a portion of target 80 and a portion of substrate 10, resulting in deposition of layer 30 a diagrammatically shown in FIG. 10.

Utilizing processing as herein described can and has resulted in significantly improved bottom step coverage of a deposited metal source layer as compared to the methods described in our Ser. No. 09/026,104 application. As a specific example, bottom step coverage of up to 35% as compared to layer depth outside of the contact has been demonstrated on 0.275 micron contact openings having an aspect ratio of 8. Processing as described in our Ser. No . 09/026,104 disclosure achieved bottom step coverage of less than 5%. For example, better $R_S$ uniformity has been demonstrated in formation of $TiN_x$ films at 330 to 350 Angstroms utilizing the processes in accordance with the invention as compared to those of the Ser. No. 09/026,104 disclosure. A specific example where such was demonstrated was in utilization of the IMP reactor at a DC target power of 2.0 kW, $RF_1$ at 2.8, $RF_2$ at 0W, argon and nitrogen flows at 30 and 40 sccm, respectively.

Figure 3:
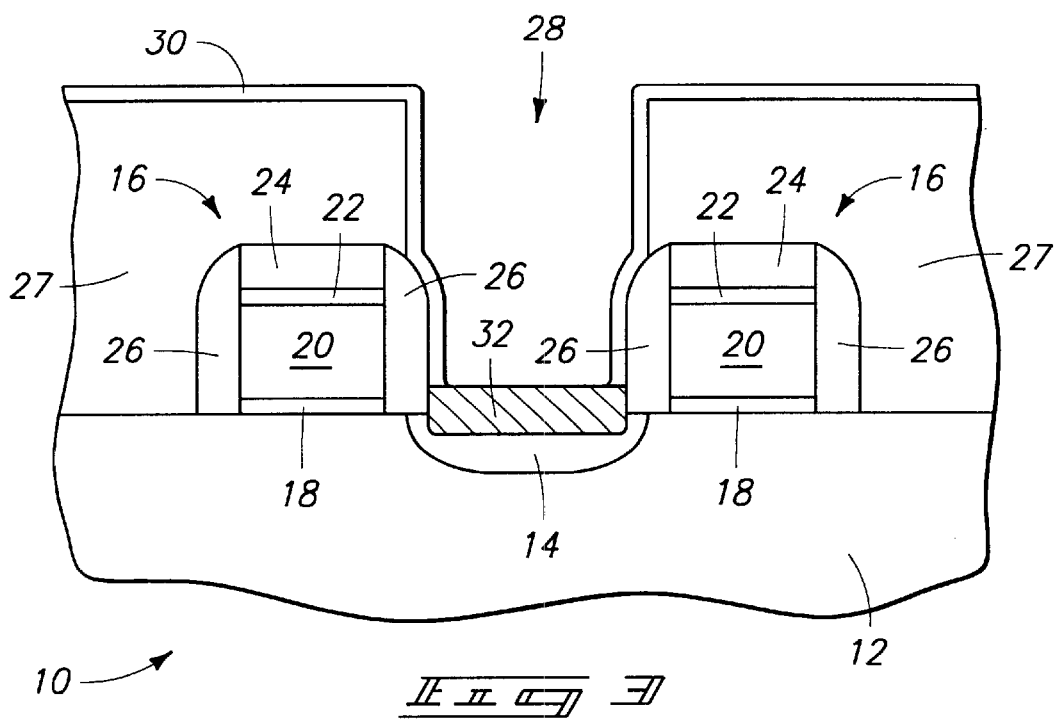
FIG. 3 is a view of the FIG. 1 wafer fragment at a processing step subsequent to that shown by FIG. 2.

A preferred and additional aspect of the invention comprises reacting the $MN_x$ comprising layer with material of the substrate upon which the layer is deposited. Such reacting could occur during the deposition (i.e., during operation of the reactor in carrying out the deposit), or after the deposition is complete. One preferred and specific example is reaction of "M" with silicon on the substrate to form a metal silicide. FIG. 3 illustrates an example whereby reacting occurs to form a silicide. Specifically, substrate 10 has been exposed to suitable annealing conditions (i.e., in an inert ambient between 500° C. to about 850° C., with a range of between 650° C. and 750° C. in an $N_2$ ambient being preferred). As shown, such is effective to consume silicon of substrate region 14 suitably to form a metal silicide region 32. Such can and preferably consumes less silicon from substrate region 14 than a layer consisting essentially of an elemental refractory metal. For example $TiN_x$, where "x" ranges from 0.2 to 0.8, has been shown to consume about 50% to 60% of the $TiN_x$ layer thickness during a 600 to 710° C. RTP anneal, as compared to 200% of the thickness of an elemental titanium layer of silicon consumption for silicidation under the same conditions. $TiN_x$ can remain in the silicide film, with most residing at the grain boundaries of the silicide.

Figure 4:
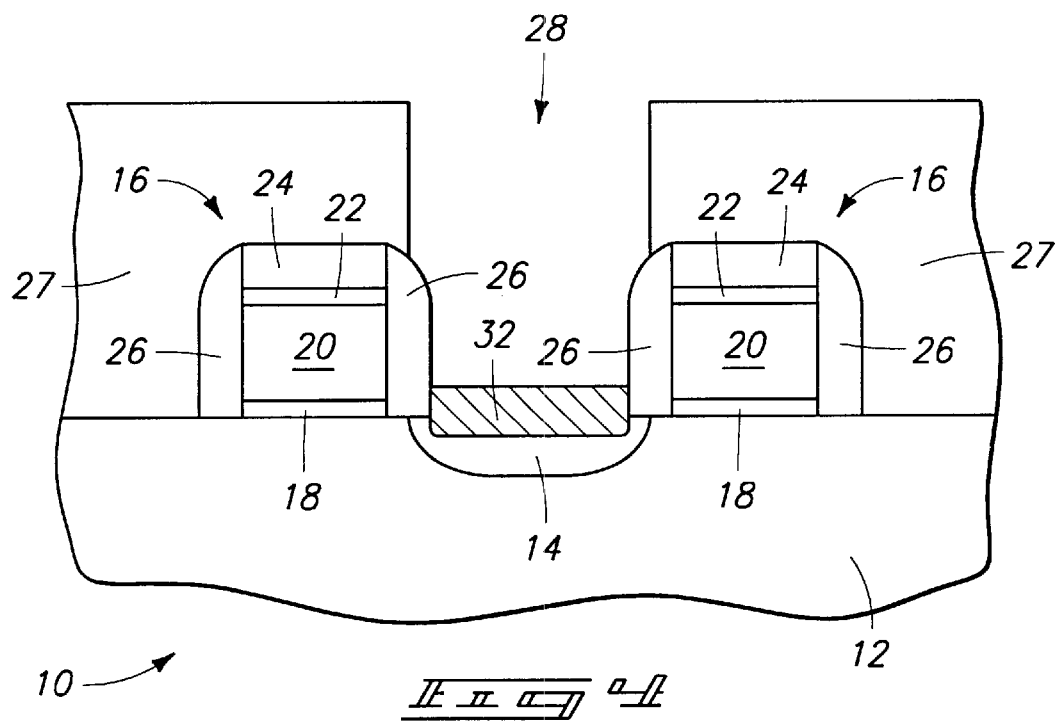
FIG. 4 is a view of the FIG. 1 wafer fragment at a processing step subsequent to that shown by FIG. 3.

Referring to FIG. 4, a conventional selective wet strip of the unreacted $TiN_x$ layer relative to the exposed oxide and silicide has been conducted. A specific example chemistry includes an ammonia and peroxide mix at 65° C.

Figure 5:
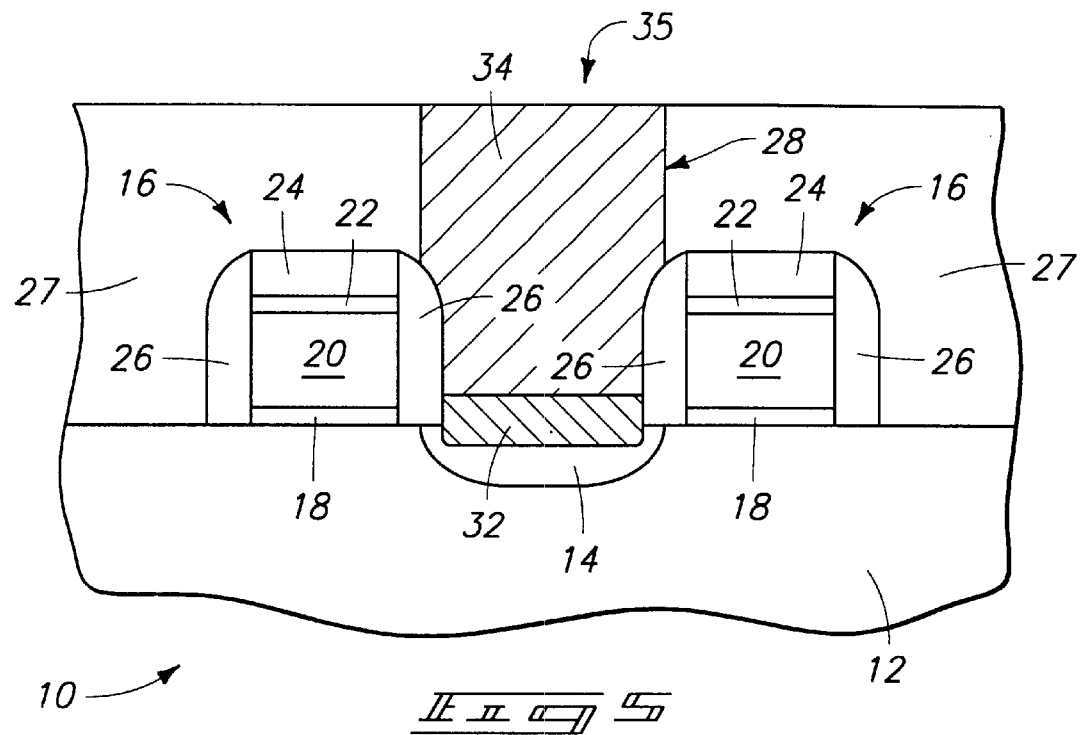
FIG. 5 is a view of the FIG. 1 wafer fragment at a processing step subsequent to that shown by FIG. 4.

Referring to FIG. 5, a conductive material 34 has been deposited and planarized back to form the illustrated conductive contact plug 35 within contact opening 28. Material 34 might also, of course, be deposited and patterned to form a conductive line or other component outwardly of insulative layer 27 as opposed to being planarized back as shown. Exemplary materials for layer 34 comprise conductively doped polysilicon, elemental metal layers, alloy layers, or conductive metal compound layers.

Figure 6:
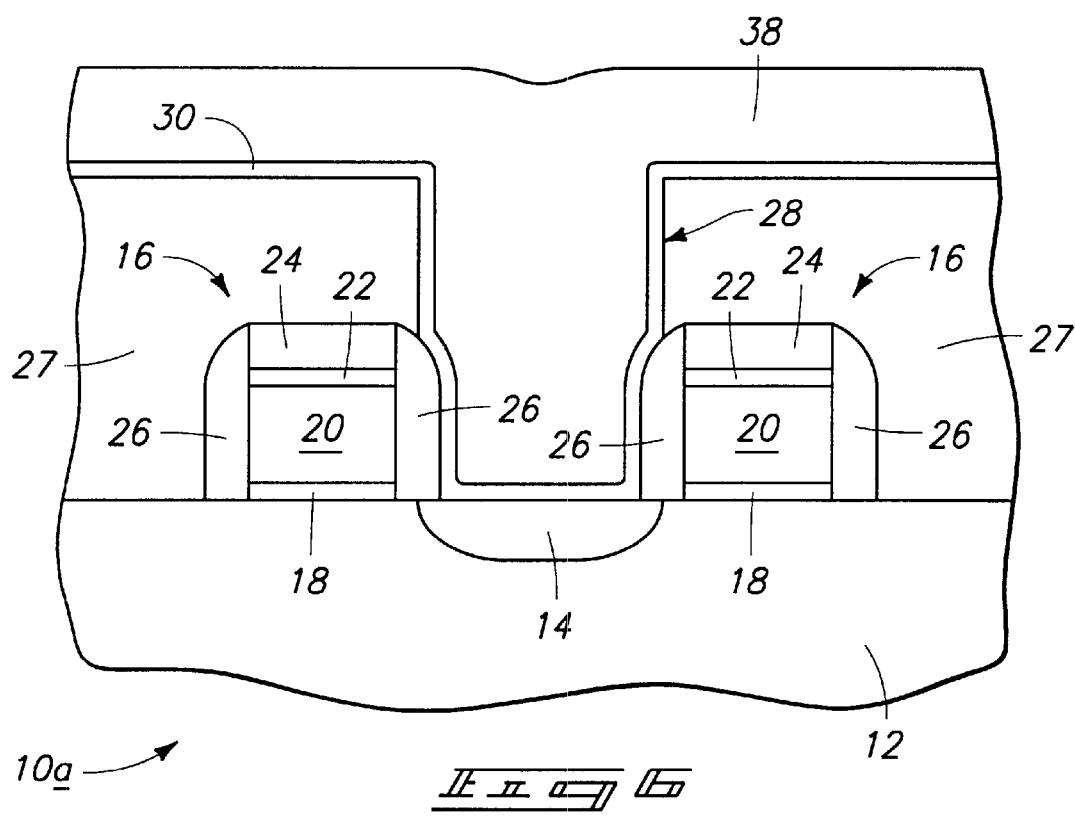
FIG. 6 is a diagrammatic sectional view of an exemplary semiconductor wafer fragment at one processing step in accordance with an aspect of the invention as would occur alternately to the processing depicted in sequence to that of FIG. 3 in the first described embodiment.

Alternate exemplary processing to that depicted by FIGS. 3–5 is described with reference to FIGS. 6–8. Like numerals from the first-described embodiment are utilized where appropriate, with differences being indicated by the suffix "a" or with different numerals. Wafer fragment 10a in FIG. 6 depicts the same processing through that shown in FIG. 2, plus with subsequent deposition of a silicon layer 38 having been made within contact opening 28. Such deposition preferably completely fills the remaining void volume of contact opening 28, as shown. Preferred materials for layer 28 include monocrystalline silicon and polycrystalline silicon.

Figure 7:
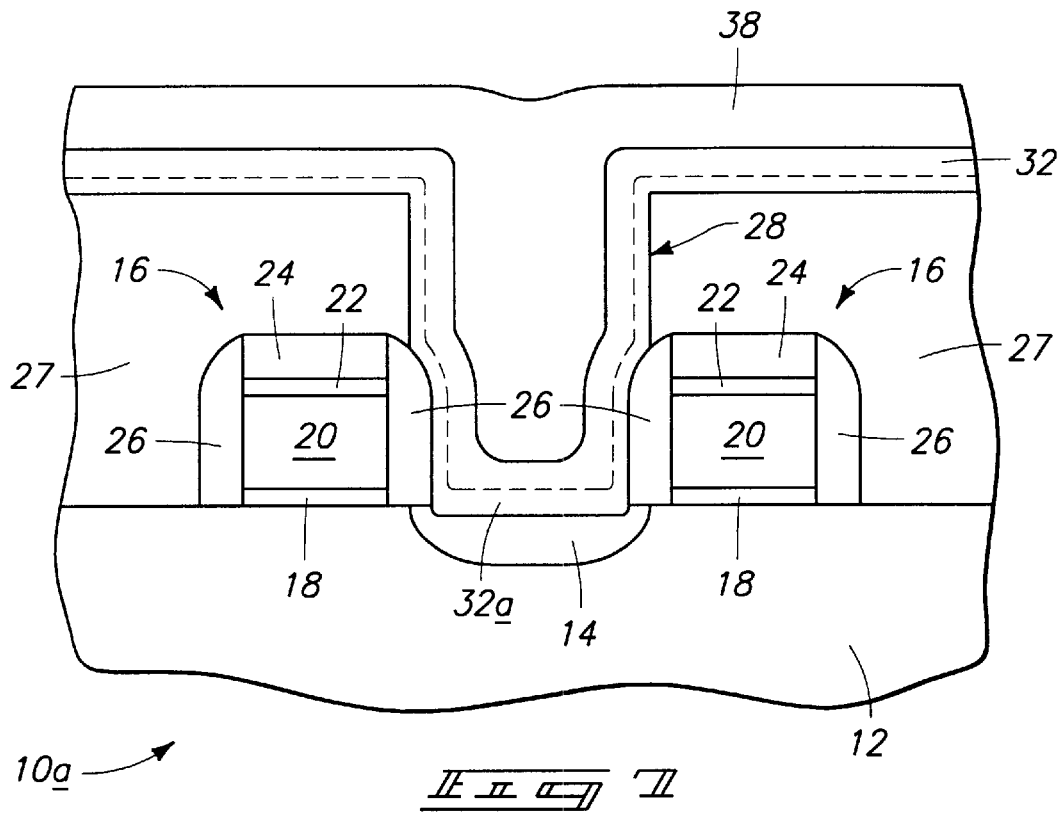
FIG. 7 is a view of the FIG. 6 wafer fragment at a processing step subsequent to that shown by FIG. 6.

Referring to FIG. 7, substrate 10a has been annealed to form silicide region 32a within contact opening 28. Such annealing is preferably under conditions as described above, and consumes silicon from both underlying diffusion region 14 of silicon comprising substrate 12, and overlying silicon layer 38. Most preferably, the construction is such that the silicidation can be performed to preferentially consume silicon from silicon source layer 38 as compared to silicon from substrate 12 in a ratio greater than 1:1. Preferably, the ratio is greater than about 1.2:1, with greater than 2:1 and even greater than 3:1 being preferred and having been demonstrated. Accordingly in preferred implementations, the quantity of silicide sinking below the surface of substrate 12 ideally represents less than or equal to 30% of the total silicide thickness in the contact, and preferably even less than about 20%, which is about 200 Angstroms for a 1,000 Angstroms junction 14 thickness.

Figure 8:
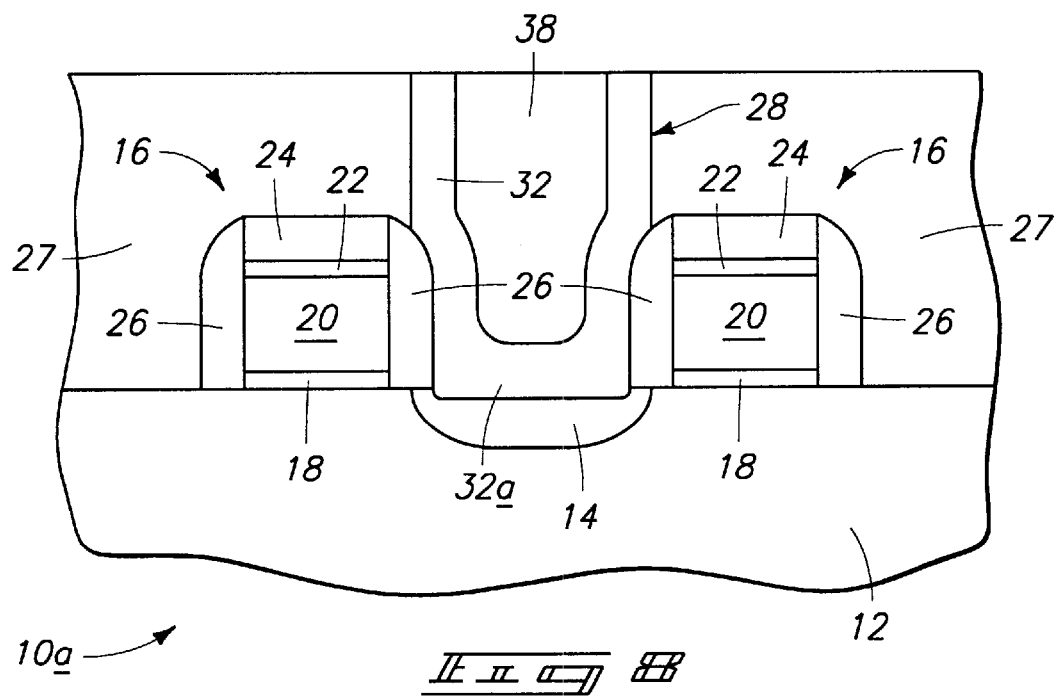
FIG. 8 is a view of the FIG. 6 wafer fragment at a processing step subsequent to that shown by FIG. 7.

The FIG. 7 construction above insulative layer 27 can be patterned into a conductive line or other component, or for example planarized back, as depicted in FIG. 8.

In accordance with an aspect of the invention, there exists at least one preferred method of selecting reactor operating parameters to achieve deposit of metal source layers comprising a metal and a non-metal impurity. Specifically, the reactor operation is preferably conducted to achieve bulk resistivity in the deposited layer within about 15% of a maximum bulk resistivity for unsaturated metal layers having the same metal and non-metal impurity, such as $MN_x$ materials. Such unsaturated metal layers, or a metal-rich class of $MN_x$ materials, are preferably characterized at least in part by variable non-metal impurity quantity (i.e., "x" variability for $MN_x$ materials). For example, it has been found that achieving maximum bulk resistivity of the deposited metal source layer results in lower amounts of silicon being consumed from underlying silicon material. Maximized bulk resistivity in the layer as deposited is believed to depict optimal impurity incorporation and homogenous distribution thereof throughout the layer short of significant stoichiometric compound formation.

Accordingly, one aspect of the invention includes forming a metal source layer in an integrated circuit where the metal source layer comprises a metal and a non-metal impurity. The method comprises selecting some sputtering ambient for a sputter deposition reactor having an inductive coil positioned therein to achieve within about 15% of the maximal resistivity for unsaturated metal layers (i.e., $MN_x$ where "x" is greater than 0 and less than 1) having the same metal and non-metal impurity. A metallic target is then sputtered in the selected ambient within the reactor.

Alternately considered and in accordance with another aspect of the invention, an integrated circuitry fabricator selects a metal layer incorporating a non-metal layer impurity to a level below saturation. The unsaturated metal layer has a bulk resistivity within about 15% of a maximal resistivity for unsaturated metal layers having the same metal and impurity. A sputter deposition reactor as described above to include an inductive coil positioned therein is operated in a manner to deposit the selected metal layer. The deposited metal layer and underlying substrate are thereafter annealed to perform a silicide interconnect over a silicon comprising substrate.

Many examples might be utilized for selecting the desired sputtering ambient in one aspect or for selecting the metal layer in another aspect. A preferred process for achieving the same is described with reference to FIG. 11. Such depicts a preferred method for choosing an optimal region for sputter formation of a $TiN_x$ layer (with "x" being less than 1 and greater than 0) from an elemental titanium target utilizing an $N_2$ and Ar plasma ambient. Bulk resistivity of $TiN_x$ for "x" ranging from 0 to up to an including 1 is plotted as a function of $RF_1/DC$ power ratios for an exemplary $Ar/N_2$ constant volumetric feed ratio of 30/40. As shown for two different curves, reactive sputtering of titanium falls into two respective main regions. A Region I constitutes an unsaturated or less than stoichiometric state where "x" is less than 1, whereas Region II depicts a saturated or stoichiometric state where a TiN compound is predominately formed. Points A and A' represents a respective maximum bulk resistivity in the unsaturated state for different $RF_2$ bias powers. The $RF_2'$ bias was lower (300 W) than $RF_2$ bias (500 W). The FIG. 11 plots were determined by processing a plurality of substrates and forming a plurality of test metal source layers thereover.

Accordingly, the invention in but one aspect contemplates forming a plurality of test metal source layers (i.e., some $MN_x$ layers at least where "x" is less than 1) over a plurality of substrates within the deposition reactor having an inductive coil positioned therein. The test metal source layers are formed by sputtering in a plurality of test sputtering ambients at least characterized by varying ratios of inductive power to target power ($RF_1$:DC). Preferably as shown in the preferred FIG. 11 embodiment, the test sputtering ambients are further characterized by a substantially constant ratio of flow rates of nitrogen source gas to a sputtering gas. Further as shown by the preferred FIG. 11 embodiment with respect to each respective depicted curve, the test sputtering ambients are further characterized by a substantially constant bias power on the substrates.

Figure 11:
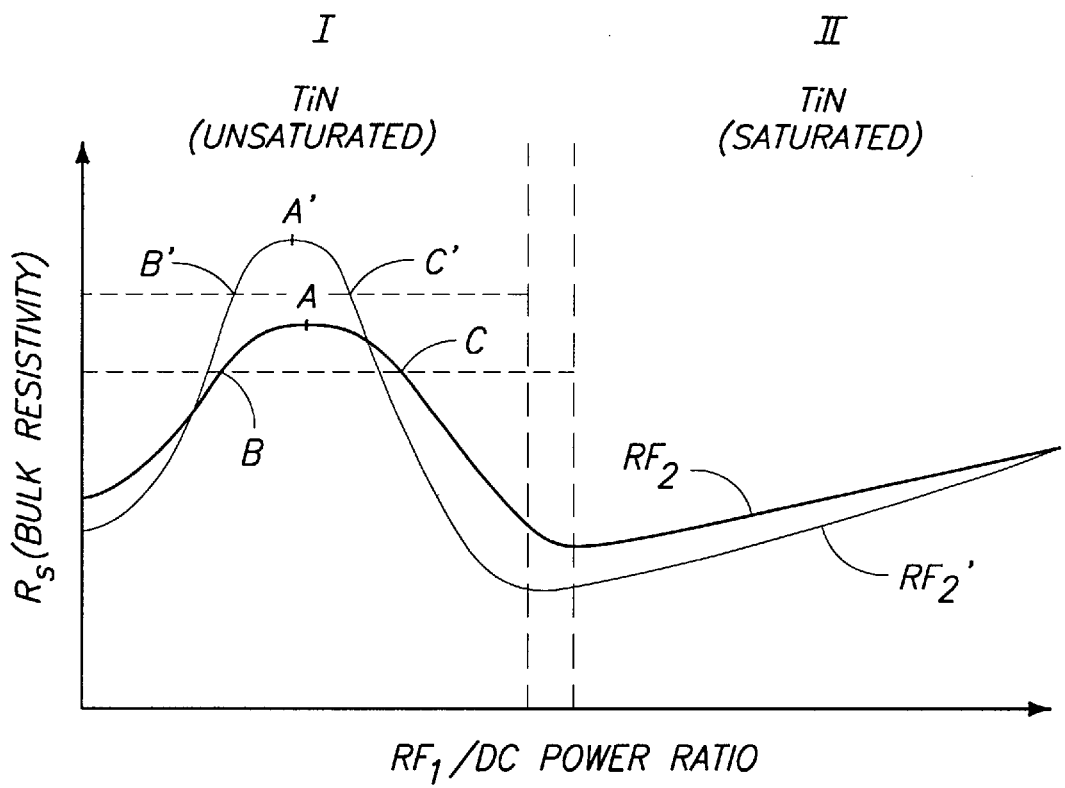
FIG. 11 is a diagrammatic plot of bulk resistivity as a function of $RF_1$ power to DC power ratios in a reactive sputtering at a given target power and gas flow for Ti—N layers comprising different titanium and nitrogen quantities.

Bulk resistivities of the test material wafers are thereafter measured, for example to achieve data such as depicted by the preferred example FIG. 11 embodiment. The integrated circuity fabricator can then determine and select a set of operating parameters for separately plasma processing a plurality of semiconductor substrates within the chamber at least partially from the measured bulk resistivities of the test material layers. Thereafter, the fabricator processes the plurality of semiconductor substrates within the chamber using at least some of the selected parameters. Said some of the selected parameters may include one or more of the $RF_1/DC$ power ratio, the sputtering gas and nitrogen source gas ratio, and bias power. Most preferred, the selected parameters at least include some range of ratio of inductive power to target power to produce the metal source layer with a bulk resistivity within about 15% of a maximum bulk resistivity among the test material source layers. Points B and C, and B' and C', represent the lower and higher ratios, respectively, within 15% which result in a preferred $TiN_x$ film defining a preferred processing window in accordance with the above-described subsequent silicidation processing.

As a specific example, data point "A" was achieved at a DC power of 2.0 kW, a $RF_1$ power equal to 2.8 kW for an $RF_2$ bias of 500 W. Data point A' was achieved for $RF_2$ equal to 300 W, with $RF_1$ being at about 2.0 MHz, and $RF_2$ being at 13.56 MHz for both.

In another considered aspect of the invention, as exemplified in the immediate above description with respect to FIG. 11, the invention comprises a method of analyzing impact of operating parameter changes for a plasma deposition reactor having an inductive coil positioned therein.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of depositing a nitrogen enriched metal layer over a semiconductor substrate comprising:

providing a sputter deposition reactor chamber having an inductive coil postioned therein, a metallic target position therein, and a semiconductor substrate positioned therein;

feeding a nitrogen containing source gas and a sputtering gas to the reactor chamber;

operating the reactor to provide a selected target power, inductive coil power and substrate bias during the feeding effective to deposit an $MN_x$ comprising layer on the substrate, where "M" is an elemental metal and "x" is greater than 0 and less than 1; and comprising reacting the $MN_x$ comprising layer with material of the substrate upon which the layer is deposited.

2. The method of claim 1 wherein the reacting occurs after the operating.

3. The method of claim 2 wherein the material of the substrate comprises silicon and a metal silicide is formed from the reacting.

4. The method of claim 1 wherein the reacting occurs during the operating.

5. The method of claim 4 wherein the material of the substrate comprises silicon and a metal silicide is formed from the reacting.

6. The method of claim 1 wherein the material of the substrate comprises silicon and a metal silicide is formed from the reacting.

7. A method of depositing a nitrogen enriched metal layer over a semiconductor substrate comprising:

providing a sputter deposition reactor chamber having an inductive coil positioned therein, a metallic target position therein, and a semiconductor substrate positioned therein;

feeding a nitrogen containing source gas and a sputtering gas to the reactor chamber;

operating the reactor to provide a selected target power, inductive coil power and substrate bias during the feeding effective to deposit an $MN_x$ comprising layer on the substrate, where "M" is an elemental metal and "x" is greater than 0 and less than 1; and comprising conducting the operating to achieve bulk resistivity in the deposited layer within about 15% of a maximum bulk resistivity within a metal-rich class of $MN_x$ materials.

8. The method of claim 7 wherein the metal-rich class is characterized at least in part by variable "x".

9. A method of forming a silicide contact to a silicon comprising substrate, comprising:

forming a contact opening through an insulative material to expose silicon of the silicon comprising substrate;

providing a sputter deposition reactor chamber having an inductive coil positioned therein, a metallic target position therein, and the silicon comprising substrate after said forming positioned therein;

feeding a nitrogen containing source gas and a sputtering gas to the reactor chamber;

operating the reactor to provide a selected target power, inductive coil power and substrate bias during the feeding effective to deposit an $MN_x$ comprising layer within the contact opening, where "M" is an elemental metal and "x" is greater than 0 and less than 1; and after the operating, forming a silicon layer within the contact opening.

10. The method of claim 9 further comprising annealing the substrate after the operating to form the silicide from the $MN_x$ layer.

11. The method of claim 9 further comprising annealing the substrate to form the silicide after the forming of the silicon layer within the contact opening, the annealing consuming silicon from both the underlying exposed portion of silicon comprising substrate and the overlying silicon layer.

12. The method of claim 11 wherein less of the underlying substrate is consumed than the overlying silicon layer.

13. The method of claim 9 wherein "M" is titanium, and the target consists essentially of elemental titanium.

14. The method of claim 9 wherein the nitrogen containing source gas comprises $N_2$, and the sputtering gas comprises a noble gas.

15. The method of claim 9 comprising conducting the operating to achieve bulk resistivity in the deposited layer within about 15% of a maximum bulk resistivity within a metal-rich class of $MN_x$ materials.

16. The method of claim 15 wherein the metal-rich class is characterized at least in part by variable "x".

17. A method of forming a metal source layer in an integrated circuit, the metal source layer comprising a metal and a non-metal impurity, the method comprising:

selecting a sputtering ambient for a sputter deposition reactor having an inductive coil positioned therein to achieve within about 15% of a maximal resistivity for unsaturated metal layers having the same metal and non-metal impurity; and sputtering a metallic target in the selected ambient within the reactor.

18. The method of claim 17 wherein the non-metal impurity comprises nitrogen.

19. The method of claim 17 wherein the metal is titanium.

20. The method of claim 17 wherein the unsaturated metal layers having the same metal and non-metal impurity are characterized at least in part by variable non-metal impurity quantity.

21. The method of claim 17 wherein selecting the sputtering ambient comprises:

forming a plurality of test metal source layers over a plurality of substrates within the reactor, the test metal source layers being formed by sputtering in a plurality of test sputtering ambients, the test sputtering ambients being characterized by varying ratios of inductive power to target power; and measuring bulk resistivities of the test material layers.

22. The method of claim 21 wherein the test sputtering ambients are further characterized by a substantially constant ratio of flow rates of a nitrogen source gas to a sputtering gas.

23. The method of claim 22 wherein the selected ambient includes said ratio.

24. The method of claim 21 wherein the test sputtering ambients are further characterized by a substantially constant bias power on the substrates.

25. The method of claim 24 wherein the selected ambient includes said substrate bias power.

26. The method of claim 25 wherein said substrate bias power is from 0 to 1000 W.

27. The method of claim 21 wherein selecting the sputtering ambient comprises selecting a ratio of inductive power to target power to produce the metal source layer with a bulk resistivity within about 15% of a maximum bulk resistivity among the test metal source layers.

28. The method of claim 27 wherein the inductive power ranges from 1.0 kW to 5.0 kW, and the target power ranges from 1.0 kW to 5.0 kW.

29. The method of claim 21 wherein the metal source layers are characterized at least in part by variable non-metal impurity quantity.

30. A method of forming a silicide interconnect over a silicon comprising substrate comprising:

selecting a metal layer incorporating a non-metal impurity to a level below saturation, the unsaturated metal layer having a bulk resistivity within about 15% of a maximal resistivity for unsaturated metal layers having the same metal and impurity;

providing a sputter deposition reactor chamber having an inductive coil positioned therein, a target comprising the same metal positioned therein, and a silicon comprising substrate having exposed silicon therein;

operating the reactor to provide a selected target power, inductive coil power and substrate bias effective to deposit the selected layer over the exposed silicon; and annealing the selected layer and the substrate.

31. The method of claim 30 wherein the metal comprises titanium, and the non-metal impurity comprises nitrogen.

32. The method of claim 30 wherein the non-metal impurity comprises nitrogen, and further comprising feeding $N_2$ and a noble gas to the reactor during the operating.

33. The method of claim 30 further comprising depositing a silicon layer over the selected metal layer prior to the annealing.

34. A method of forming a suicide contact to a semiconductor substrate comprising:

forming a contact opening in an insulating layer to expose a silicon comprising active region of a semiconductor substrate;

providing a sputter deposition reactor chamber having an inductive coil positioned therein, a refractory metal comprising target positioned therein, and the substrate with contact opening therein;

operating the reactor to provide a selected target power, inductive coil power and substrate bias effective to deposit a refractory metal source layer into the contact opening directly over the active region of the substrate;

depositing a silicon source layer directly over the refractory metal source layer; and performing a silicidation to form the silicide contact by preferentially consuming silicon from the silicon source layer as compared to silicon from the substrate in a ratio of greater than about 1.2:1.

35. The method of claim 34 wherein the silicidation preferentially consumes silicon from the silicon source layer compared to silicon from the substrate in a ratio of greater than about 2:1.

36. The method of claim 34 wherein the silicidation preferentially consumes silicon from the silicon source layer compared to silicon from the substrate in a ratio of greater than about 3:1.

37. A method of analyzing impact of operating parameter changes for a plasma deposition reactor having an inductive coil positioned therein comprising:

forming a plurality of test $MN_x$ comprising layers over a plurality of substrates, where "M" is an elemental metal and "x" is greater than 0 and less than 1, the test $MN_x$ comprising layers being formed by sputtering a target comprising "M" in a sputter deposition chamber having an inductive coil positioned therein and in a plurality of test sputtering ambients, the test sputtering ambients being characterized by a substantially constant ratio of flow rates of a nitrogen source gas to a sputtering gas and by varying ratios of inductive power to target power; and measuring bulk resistivity of the test $MN_x$ comprising layers.

38. The method of claim 37 wherein the test sputtering ambients are further characterized by a substantially constant bias power on the substrates.

39. The method of claim 37 wherein "M" is titanium, and the target consists essentially of elemental titanium.

40. The method of claim 37 wherein the test $MN_x$ comprising layers are characterized at least in part by variable "x".

41. The method of claim 37 wherein "x" is from 0.2 to 0.8.

42. The method of claim 37 wherein "x" is from 0.5 to 0.6.

43. A method of forming integrated circuitry comprising:

forming a plurality of test $MN_x$ comprising layers over a plurality of substrates, where "M" is an elemental metal and "x" is greater than 0 and less than 1, the test $MN_x$ comprising layers being formed by sputtering a target comprising "M" in a sputter deposition chamber having an inductive coil positioned therein and in a plurality of test sputtering ambients, the test sputtering ambients being characterized by a substantially constant ratio of flow rates of a nitrogen source gas to a sputtering gas and by varying ratios of inductive power to target power;

measuring bulk resistivities of the test $MN_x$ comprising layers;

determining and selecting a set of operating parameters for separately plasma processing a plurality of semiconductor substrates within the chamber at least partially from the measured bulk resistivities of the test $MN_x$ comprising layers; and processing the plurality of semiconductor substrates within the chamber using at least some of the selected parameters.

44. The method of claim 43 wherein the some of the selected parameters include said ratio.

45. The method of claim 43 wherein the test sputtering ambients are further characterized by a substantially constant bias power on the substrates.

46. The method of claim 45 wherein the some of the selected parameters include said substrate bias power.

47. The method of claim 46 wherein the some of the selected parameters include said ratio.

48. The method of claim 43 wherein "M" is titanium, and the target consists essentially of elemental titanium.

49. The method of claim 43 wherein "x" is from 0.2 to 0.8.

50. The method of claim 43 wherein "x" is from 0.5 to 0.6.

51. The method of claim 43 wherein the test $MN_x$ comprising layers are characterized at least in part by variable "x".

* * * * *

UNITED STATES PATENT AND TRADEMARK OFFICE
CERTIFICATE OF CORRECTION

PATENT NO. : 6,365,507 B1
DATED : April 2, 2002
INVENTOR(S) : Yongjun Jeff Hu

It is certified that error appears in the above-identified patent and that said Letters Patent is hereby corrected as shown below:

Column 10,
Line 43, replace "A method of forming a suicide contact" with -- A method of forming a silicide contact --

Signed and Sealed this

Third Day of September, 2002

*Attest:*

*Attesting Officer*

JAMES E. ROGAN
*Director of the United States Patent and Trademark Office*